US011398839B2

United States Patent
(12) Park et al.

(10) Patent No.: US 11,398,839 B2
(45) Date of Patent: Jul. 26, 2022

(54) BIT INTERLEAVER FOR LOW-DENSITY PARITY CHECK CODEWORD HAVING LENGTH OF 64800 AND CODE RATE OF 7/15 AND QUADRATURE PHASE SHIFT KEYING, AND BIT INTERLEAVING METHOD USING SAME

(71) Applicant: ELECTRONICS AND TELECOMMUNICATIONS RESEARCH INSTITUTE, Daejeon (KR)

(72) Inventors: Sung-Ik Park, Daejeon (KR); Sun-Hyoung Kwon, Daejeon (KR); Jae-Young Lee, Daejeon (KR); Heung-Mook Kim, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/323,949

(22) Filed: May 18, 2021

(65) Prior Publication Data

US 2021/0273657 A1 Sep. 2, 2021

Related U.S. Application Data

(63) Continuation of application No. 16/542,035, filed on Aug. 15, 2019, now Pat. No. 11,038,534, which is a (Continued)

(30) Foreign Application Priority Data

Jan. 29, 2014 (KR) ........................ 10-2014-0011492
Jan. 7, 2015 (KR) ........................ 10-2015-0002166

(51) Int. Cl.
*H03M 13/27* (2006.01)
*H03M 13/11* (2006.01)
(Continued)

(52) U.S. Cl.
CPC ... *H03M 13/2757* (2013.01); *H03M 13/1102* (2013.01); *H03M 13/116* (2013.01);
(Continued)

(58) Field of Classification Search
CPC .......... H03M 13/2757; H03M 13/2792; H04L 1/0071
See application file for complete search history.

(56) References Cited

U.S. PATENT DOCUMENTS 7,535,975 B1 * 5/2009 ten Brink ................ H04L 27/34 375/268
8,948,304 B2 2/2015 Jeong et al.
(Continued)

FOREIGN PATENT DOCUMENTS

EP 2525495 A1 11/2012
KR 10-2012-0025358 A 3/2012

OTHER PUBLICATIONS

"Digital Video Broadcasting (DVB): Next Generation broadcasting system to Handheld, physical layer specification (DVB-NGH)", DVB document A160, Nov. 2012, pp. 1-295.

*Primary Examiner* — Joseph D Torres

(57) ABSTRACT

A bit interleaver, a bit-interleaved coded modulation (BICM) device and a bit interleaving method are disclosed herein. The bit interleaver includes a first memory, a processor, and a second memory. The first memory stores a low-density parity check (LDPC) codeword having a length of 64800 and a code rate of 7/15. The processor generates an interleaved codeword by interleaving the LDPC codeword on a bit group basis. The size of the bit group corresponds
(Continued)

to a parallel factor of the LDPC codeword. The second memory provides the interleaved codeword to a modulator for quadrature phase shift keying (QPSK) modulation.

5 Claims, 6 Drawing Sheets

Related U.S. Application Data continuation of application No. 15/402,107, filed on Jan. 9, 2017, now Pat. No. 10,419,031, which is a continuation of application No. 14/606,949, filed on Jan. 27, 2015, now Pat. No. 9,577,678.

(51) Int. Cl.

| | |
|---|---|
| ***H04L 1/00*** | (2006.01) |
| ***H04L 27/20*** | (2006.01) |
| ***H04L 27/34*** | (2006.01) |
| ***H03M 13/25*** | (2006.01) |
| ***H03M 13/00*** | (2006.01) |

(52) U.S. Cl.

CPC ..... *H03M 13/1185* (2013.01); *H03M 13/255* (2013.01); *H03M 13/2778* (2013.01); *H03M 13/2792* (2013.01); *H03M 13/616* (2013.01); *H03M 13/6552* (2013.01); *H04L 1/0041* (2013.01); *H04L 1/0057* (2013.01); *H04L 1/0058* (2013.01); *H04L 1/0071* (2013.01); *H04L 27/20* (2013.01); *H04L 27/3416* (2013.01)

(56) References Cited

U.S. PATENT DOCUMENTS 9,276,687 B1 * 3/2016 Jeong .................... H04H 20/71
2004/0086059 A1 5/2004 Eroz et al.
2005/0002472 A1 * 1/2005 Lee ...................... H04L 25/067 375/316
2005/0008084 A1 * 1/2005 Zhidkov .......... H04L 25/03292 375/343
2005/0257112 A1 * 11/2005 Baliga .................. H04L 27/265 714/746
2007/0011570 A1 * 1/2007 Jeong ................... H03M 13/31 714/758
2007/0165729 A1 * 7/2007 Ha ..................... H04L 27/2647 375/260
2009/0225894 A1 * 9/2009 Yoshii .................... H04L 25/05 375/295
2011/0075710 A1 3/2011 Park et al.
2011/0167317 A1 7/2011 Kim et al.
2013/0254617 A1 9/2013 Shinohara et al.
2013/0290816 A1 10/2013 Shinohara et al.
2013/0311850 A1 * 11/2013 Shinohara ............ H04L 1/0045 714/758
2014/0068385 A1 * 3/2014 Zhang ................ H03M 13/253 714/776
2016/0065242 A1 * 3/2016 Park ..................... H04L 1/0042 714/776

* cited by examiner

BIT INTERLEAVER FOR LOW-DENSITY PARITY CHECK CODEWORD HAVING LENGTH OF 64800 AND CODE RATE OF 7/15 AND QUADRATURE PHASE SHIFT KEYING, AND BIT INTERLEAVING METHOD USING SAME

CROSS-REFERENCE TO RELATED APPLICATIONS

This application is a continuation of U.S. patent application Ser. No. 16/542,035, filed Aug. 15, 2019, which is a continuation of U.S. patent application Ser. No. 15/402,107, filed Jan. 9, 2017, now U.S. Pat. No. 10,419,031, which is a continuation of U.S. patent application Ser. No. 14/606,949, filed Jan. 27, 2015, now U.S. Pat. No. 9,577,678, which claims the benefit of Korean Patent Application Nos. 10-2014-0011492 and 10-2015-0002166, filed Jan. 29, 2014 and Jan. 7, 2015, respectively, which are hereby incorporated by reference herein in their entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 64800 and a code rate of 7/15 and a quadrature phase shift keying (QPSK) modulator performing QPSK modulation and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 64800 and a code rate of 7/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for QPSK modulation.

The parallel factor may be 360, and each of the bit groups may include 360 bits.

The LDPC codeword may be represented by $(u_0, u_1, \ldots, u_{N_{ldpc}-1})$ (where $N_{ldpc}$ is 64800), and may be divided into 180 bit groups each including 360 bits, as in the following equation:

$$X_j=\{u_k|360\times j\leq k<360\times(j+1),0\leq k<N_{ldpc}\}\text{ for }0\leq j<N_{group}$$

where $X_j$ is an j-th bit group, $N_{ldpc}$ is 64800, and $N_{group}$ is 180.

The interleaving may be performed using the following equation using permutation order:

$$Y_j=X_{\pi(j)}\ 0\leq j\leq N_{group}$$

where $X_j$ is the j-th bit group, $Y_j$ is an interleaved j-th bit group, and π(j) is a permutation order for bit group-based interleaving (bit group-unit interleaving).

The permutation order may correspond to an interleaving sequence represented by the following equation:

interleaving sequence={152 172 113 167 100 163 159 144 114 47 161 125 99 89 179 123 149 177 1 132 37 26 16 57 166 81 133 112 33 151 117 83 52 178 85 124 143 28 59 130 31 157 170 44 61 102 155 111 153 55 54 176 17 68 169 20 104 38 147 7 174 6 90 15 56 120 13 34 48 122 110 154 76 64 75 84 162 77 103 156 128 150 87 27 42 3 23 96 171 145 91 24 78 5 69 175 8 29 106 137 131 43 93 160 108 164 12 140 71 63 141 109 129 82 80 173 105 9 66 65 92 32 41 72 74 4 36 94 67 158 10 88 142 45 126 2 86 118 73 79 121 148 95 70 51 53 21 115 135 25 168 11 136 18 138 134 119 146 0 97 22 165 40 19 60 46 14 49 139 58 101 39 116 127 30 98 50 107 35 62}

In accordance with another aspect of the present invention, there is provided a bit interleaving method, including storing an LDPC codeword having a length of 64800 and a code rate of 7/15; generating an interleaved codeword by interleaving the LDPC codeword on a bit group basis corresponding to the parallel factor of the LDPC codeword; and outputting the interleaved codeword to a modulator for QPSK modulation.

In accordance with still another aspect of the present invention, there is provided a BICM device, including an error-correction coder configured to output an LDPC codeword having a length of 64800 and a code rate of 7/15; a bit interleaver configured to interleave the LDPC codeword on a bit group basis corresponding to the parallel factor of the LDPC codeword and output the interleaved codeword; and a modulator configured to perform QPSK modulation on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
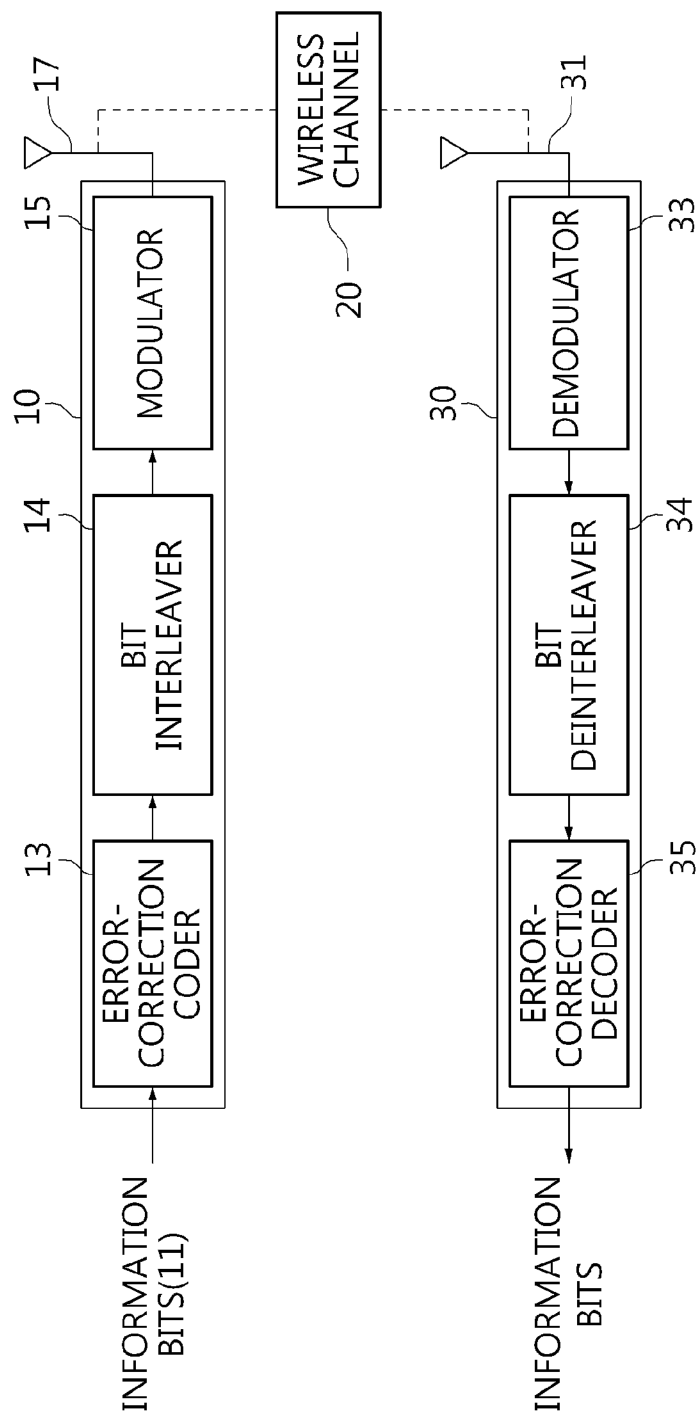
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 64800 and a code rate of 7/15. A codeword having a length of 64800 may be divided into a total of 180 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17. In this case, the modulator 15 may be a quadrature phase shift keying (QPSK) modulator. In this case, the modulator 15 is based on a concept including a symbol mapping device. In this case, the modulator 15 may be a uniform modulator, such as a quadrature amplitude modulation (QAM) modulator, or a non-uniform modulator.

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
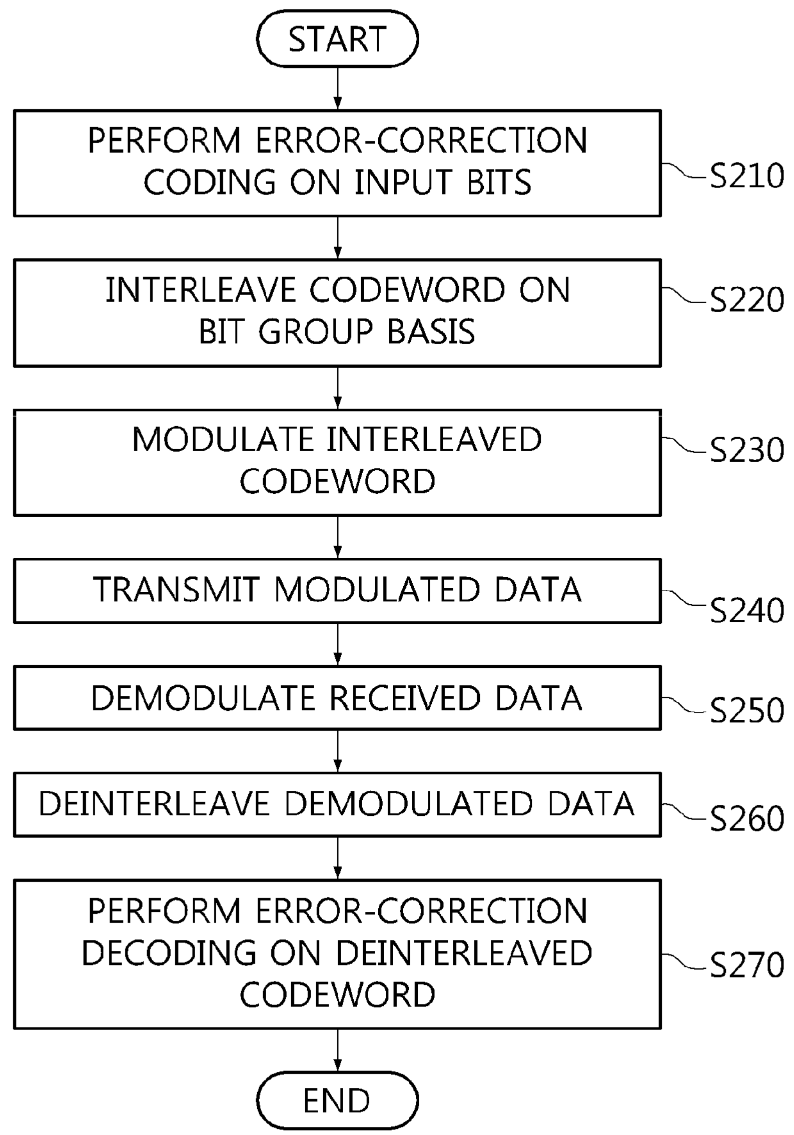
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 64800 and a code rate of 7/15. The codeword having a length of 64800 may be divided into a total of 180 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be a QPSK modulator. In this case, the modulator is based on a concept including a symbol mapping device. In this case, the modulator may be a uniform modulator, such as a QAM modulator, or a non-uniform modulator.

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \dots & J^{a_{1n}} \\ J^{a_{21}} & J^{a_{22}} & \dots & J^{a_{2n}} \\ \vdots & \vdots & \ddots & \vdots \\ J^{a_{m1}} & J^{a_{m2}} & \dots & J^{a_{mn}} \end{bmatrix}, \quad (1)$$

$$\text{for } a_{ij} \in \{0, 1, \dots, L-1, \infty\}$$

In this equation, J is a CPM having a size of L×L, and is given as the following Equation 2. In the following description, L may be 360.

$$J_{L\times L} = \begin{bmatrix} 0 & 1 & 0 & \dots & 0 \\ 0 & 0 & 1 & \dots & 0 \\ \vdots & \vdots & \vdots & \ddots & \vdots \\ 0 & 0 & 0 & \dots & 1 \\ 1 & 0 & 0 & \dots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
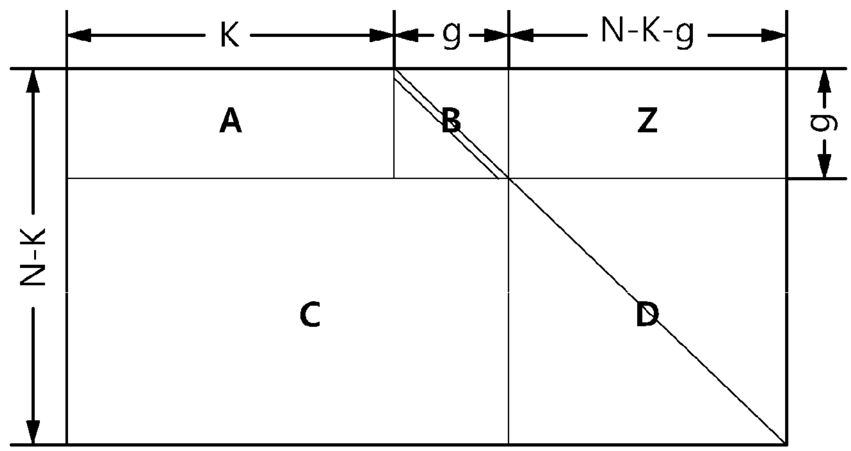
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g\times g} = \begin{bmatrix} I_{L\times L} & 0 & 0 & \dots & 0 & 0 & 0 \\ I_{L\times L} & I_{L\times L} & 0 & \dots & 0 & 0 & 0 \\ 0 & I_{L\times L} & I_{L\times L} & \vdots & 0 & 0 & 0 \\ \vdots & \vdots & \vdots & \ddots & \vdots & \vdots & \vdots \\ 0 & 0 & 0 & \dots & I_{L\times L} & I_{L\times L} & 0 \\ 0 & 0 & 0 & \dots & 0 & I_{L\times L} & I_{L\times L} \end{bmatrix} \quad (3)$$

where $I_{L\times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 7/15 and the length of a codeword is 64800, as illustrated in the following Table 1. That is, the present invention proposes an LDPC code that is designed to receive information having a length of 30240 and generate an LDPC codeword having a length of 64800.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 7/15 | 64800 | 1080 × 30240 | 1080 × 1080 | 33480 × 31320 | 33480 × 33480 | 1080 × 33480 |

The newly designed LDPC code may be represented in the form of a sequence (progression), an equivalent relationship is established between the sequence and matrix (parity bit check matrix), and the sequence may be represented, as follows:

| Sequence Table |
|---|
| 1st row: 460 792 1007 4580 11452 13130 26882 27020 32439 |
| 2nd row: 35 472 1056 7154 12700 13326 13414 16828 19102 |
| 3rd row: 45 440 772 4854 7863 26945 27684 28651 31875 |
| 4th row: 744 812 892 1509 9018 12925 14140 21357 25106 |
| 5th row: 271 474 761 4268 6706 9609 19701 19707 24870 |
| 6th row: 223 477 662 1987 9247 18376 22148 24948 27694 |
| 7th row: 44 379 786 8823 12322 14666 16377 28688 29924 |
| 8th row: 104 219 562 5832 19665 20615 21043 22759 32180 |
| 9th row: 41 43 870 7963 13718 14136 17216 30470 33428 |
| 10th row: 592 744 887 4513 6192 18116 19482 25032 34095 |
| 11th row: 456 821 1078 7162 7443 8774 15567 17243 33085 |
| 12th row: 151 666 977 6946 10358 11172 18129 19777 32234 |
| 13th row: 236 793 870 2001 6805 9047 13877 30131 34252 |
| 14th row: 297 698 772 3449 4204 11608 22950 26071 27512 |
| 15th row: 202 428 474 3205 3726 6223 7708 20214 25283 |
| 16th row: 139 719 915 1447 2938 11864 15932 21748 28598 |
| 17th row: 135 853 902 3239 18590 20579 30578 33374 34045 |
| 18th row: 9 13 971 11834 13642 17628 21669 24741 30965 |
| 19th row: 344 531 730 1880 16895 17587 21901 28620 31957 |
| 20th row: 7 192 380 3168 3729 5518 6827 20372 34168 |

-continued

| Sequence Table |
| --- |
| 21st row: 28 521 681 4313 7465 14209 21501 23364 25980 |
| 22nd row: 269 393 898 3561 11066 11985 17311 26127 30309 |
| 23rd row: 42 82 707 4880 4890 9818 23340 25959 31695 |
| 24th row: 189 262 707 6573 14082 22259 24230 24390 24664 |
| 25th row: 383 568 573 5498 13449 13990 16904 22629 34203 |
| 26th row: 585 596 820 2440 2488 21956 28261 28703 29591 |
| 27th row: 755 763 795 5636 16433 21714 23452 31150 34545 |
| 28th row: 23 343 669 1159 3507 13096 17978 24241 34321 |
| 29th row: 316 384 944 4872 8491 18913 21085 23198 24798 |
| 30th row: 64 314 765 3706 7136 8634 14227 17127 23437 |
| 31st row: 220 693 899 8791 12417 13487 18335 22126 27428 |
| 32nd row: 285 794 1045 8624 8801 9547 19167 21894 32657 |
| 33rd row: 386 621 1045 1634 1882 3172 13686 16027 22448 |
| 34th row: 95 622 693 2827 7098 11452 14112 18831 31308 |
| 35th row: 446 813 928 7976 8935 13146 27117 27766 33111 |
| 36th row: 89 138 241 3218 9283 20458 31484 31538 34216 |
| 37th row: 277 420 704 9281 12576 12788 14496 15357 20585 |
| 38th row: 141 643 758 4894 10264 15144 16357 22478 26461 |
| 39th row: 17 108 160 13183 15424 17939 19276 23714 26655 |
| 40th row: 109 285 608 1682 20223 21791 24615 29622 31983 |
| 41st row: 123 515 622 7037 13946 15292 15606 16262 23742 |
| 42nd row: 264 565 923 6460 13622 13934 23181 25475 26134 |
| 43rd row: 202 548 789 8003 10993 12478 16051 25114 27579 |
| 44th row: 121 450 575 5972 10062 18693 21852 23874 28031 |
| 45th row: 507 560 889 12064 13316 19629 21547 25461 28732 |
| 46th row: 664 786 1043 9137 9294 10163 23389 31436 34297 |
| 47th row: 45 830 907 10730 16541 21232 30354 30605 31847 |
| 48th row: 203 507 1060 6971 12216 13321 17861 22671 29825 |
| 49th row: 369 881 952 3035 12279 12775 17682 17805 34281 |
| 50th row: 683 709 1032 3787 17623 24138 26775 31432 33626 |
| 51st row: 524 792 1042 12249 14765 18601 25811 32422 33163 |
| 52nd row: 137 639 688 7182 8169 10443 22530 24597 29039 |
| 53rd row: 159 643 749 16386 17401 24135 28429 33468 33469 |
| 54th row: 107 481 555 7322 13234 19344 23498 26581 31378 |
| 55th row: 249 389 523 3421 10150 17616 19085 20545 32069 |
| 56th row: 395 738 1045 2415 3005 3820 19541 23543 31068 |
| 57th row: 27 293 703 1717 3460 8326 8501 10290 32625 |
| 58th row: 126 247 515 6031 9549 10643 22067 29490 34450 |
| 59th row: 331 471 1007 3020 3922 7580 23358 28620 30946 |
| 60th row: 222 542 1021 3291 3652 13130 16349 33009 34348 |
| 61st row: 532 719 1038 5891 7528 23252 25472 31395 31774 |
| 62nd row: 145 398 774 7816 13887 14936 23708 31712 33160 |
| 63rd row: 88 536 600 1239 1887 12195 13782 16726 27998 |
| 64th row: 151 269 585 1445 3178 3970 15568 20358 21051 |
| 65th row: 650 819 865 15567 18546 25571 32038 33350 33620 |
| 66th row: 93 469 800 6059 10405 12296 17515 21354 22231 |
| 67th row: 97 206 951 6161 16376 27022 29192 30190 30665 |
| 68th row: 412 549 986 5833 10583 10766 24946 28878 31937 |
| 69th row: 72 604 659 5267 12227 21714 32120 33472 33974 |
| 70th row: 25 902 912 1137 2975 9642 11598 25919 28278 |
| 71st row: 420 976 1055 8473 11512 20198 21662 25443 30119 |
| 72nd row: 1 24 932 6426 11899 13217 13935 16548 29737 |
| 73rd row: 53 618 988 6280 7267 11676 13575 15532 25787 |
| 74th row: 111 739 809 8133 12717 12741 20253 20608 27850 |
| 75th row: 120 683 943 14496 15162 15440 18660 27543 32404 |
| 76th row: 600 754 1055 7873 9679 17351 27268 33508 |
| 77th row: 344 756 1054 7102 7193 22903 24720 27883 |
| 78th row: 582 1003 1046 11344 23756 27497 27977 32853 |
| 79th row: 28 429 509 11106 11767 12729 13100 31792 |
| 80th row: 131 555 907 5113 10259 10300 20580 23029 |
| 81st row: 406 915 977 12244 20259 26616 27899 32228 |
| 82nd row: 46 195 224 1229 4116 10263 13608 17830 |
| 83rd row: 19 819 953 7965 9998 13959 30580 30754 |
| 84th row: 164 1003 1032 12920 15975 16582 22624 27357 |
| 85th row: 8433 11894 13531 17675 25889 31384 |
| 86th row: 3166 3813 8596 10368 25104 29584 |
| 87th row: 2466 8241 12424 13376 24837 32711 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i=s_i \text{ for } i=0,1,\ldots,K-1$$

$$p_j=0 \text{ for } j=0,1,\ldots,M_1+M_2-1 \tag{4}$$

First information bit $\lambda_0$ is accumulated at parity bit addresses specified in the 1st row of the sequence of the Sequence Table. For example, in an LDPC code having a length of 64800 and a code rate of 7/15, an accumulation process is as follows:

$$p_{460}=p_{460}\oplus\lambda_0 \quad p_{792}=p_{792}\oplus\lambda_0 \quad p_{1007}=p_{1007}\oplus\lambda_0$$
$$p_{4580}=p_{4580}\oplus\lambda_0 \quad p_{11452}=p_{11452}\oplus\lambda_0$$
$$p_{13130}=p_{13130}\oplus\lambda_0 \quad p_{26882}=p_{26882}\oplus\lambda_0$$
$$p_{27020}=p_{27020}\oplus\lambda_0 \quad p_{32439}=p_{32439}\oplus\lambda_0$$

where the addition $\oplus$ occurs in GF(2).

The subsequent L−1 information bits, that is, $\Delta_m$, m=1, 2, . . . , L−1, are accumulated at parity bit addresses that are calculated by the following Equation 5:

$$(x+m\times Q_1) \bmod M_1 \text{ if } x<M_1$$

$$M_1+\{(x-M_1+m\times Q_2) \bmod M_2\} \text{ if } x\geq M_1 \tag{5}$$

where x denotes the addresses of parity bits corresponding to the first information bit 4, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 64800 and a code rate of 7/15, $M_1=1080$, $Q_1=3$, $M_2=33480$, $Q_2=93$ and L=360, and the following operations are performed on the second bit $\lambda_1$ using Equation 5:

$$p_{463}=p_{463}\oplus\lambda_1 \quad p_{795}=p_{795}\oplus\lambda_1 \quad p_{1010}=p_{1010}\oplus\lambda_1$$
$$p_{4673}=p_{4673}\oplus\lambda_1 \quad p_{11545}=p_{11545}\oplus\lambda_1$$
$$p_{13223}=p_{13223}\oplus\lambda_1 \quad p_{26975}=p_{26975}\oplus\lambda_1$$
$$p_{27113}=p_{27113}\oplus\lambda_1 \quad p_{32532}=p_{32532}\oplus\lambda_1$$

Table 2 illustrates the sizes of $M_1$, $Q_1$, $M_2$ and $Q_2$ of the designed QC-LDPC code:

TABLE 2

| | | Sizes | | | |
| --- | --- | --- | --- | --- | --- |
| Code rate | Length | $M_1$ | $M_2$ | $Q_1$ | $Q_2$ |
| 7/15 | 64800 | 1080 | 33480 | 3 | 93 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\Delta_{K-1}$ have been exhausted, the operations of the following Equation 6 are sequentially performed from i=1:

$$p_i=p_i\oplus p_{i-1} \text{ for } i=0,1\ldots,M_1-1 \tag{6}$$

Thereafter, when a parity interleaving operation, such as that of the following Equation 7, is performed, parity bits corresponding to the dual diagonal matrix B are generated:

$$\lambda_{K+L\cdot t+s}=p_{Q_1\cdot s+t} \text{ for } 0\leq s<L, 0\leq t<Q_1 \tag{7}$$

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L\cdot t+s}=p_{M_1+Q_2\cdot s+t} \text{ for } 0\le s<L, 0\le t<Q_2 \tag{8}$$

Figure 4:
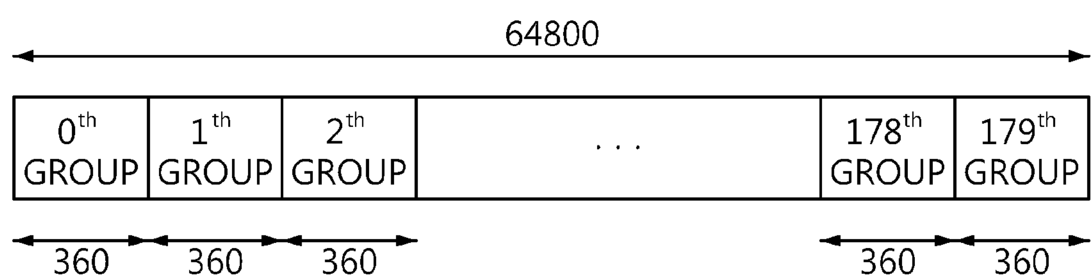
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
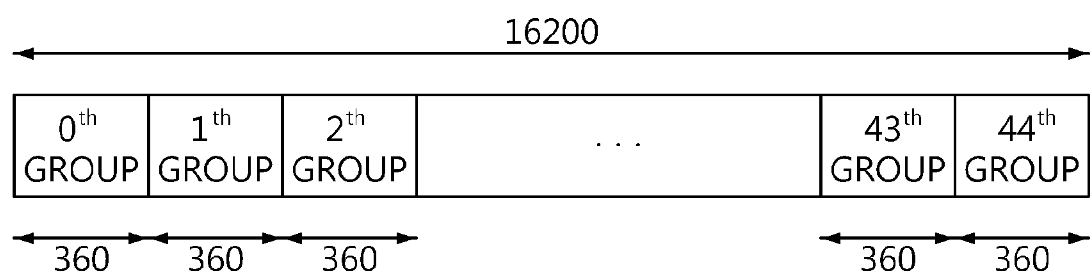
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
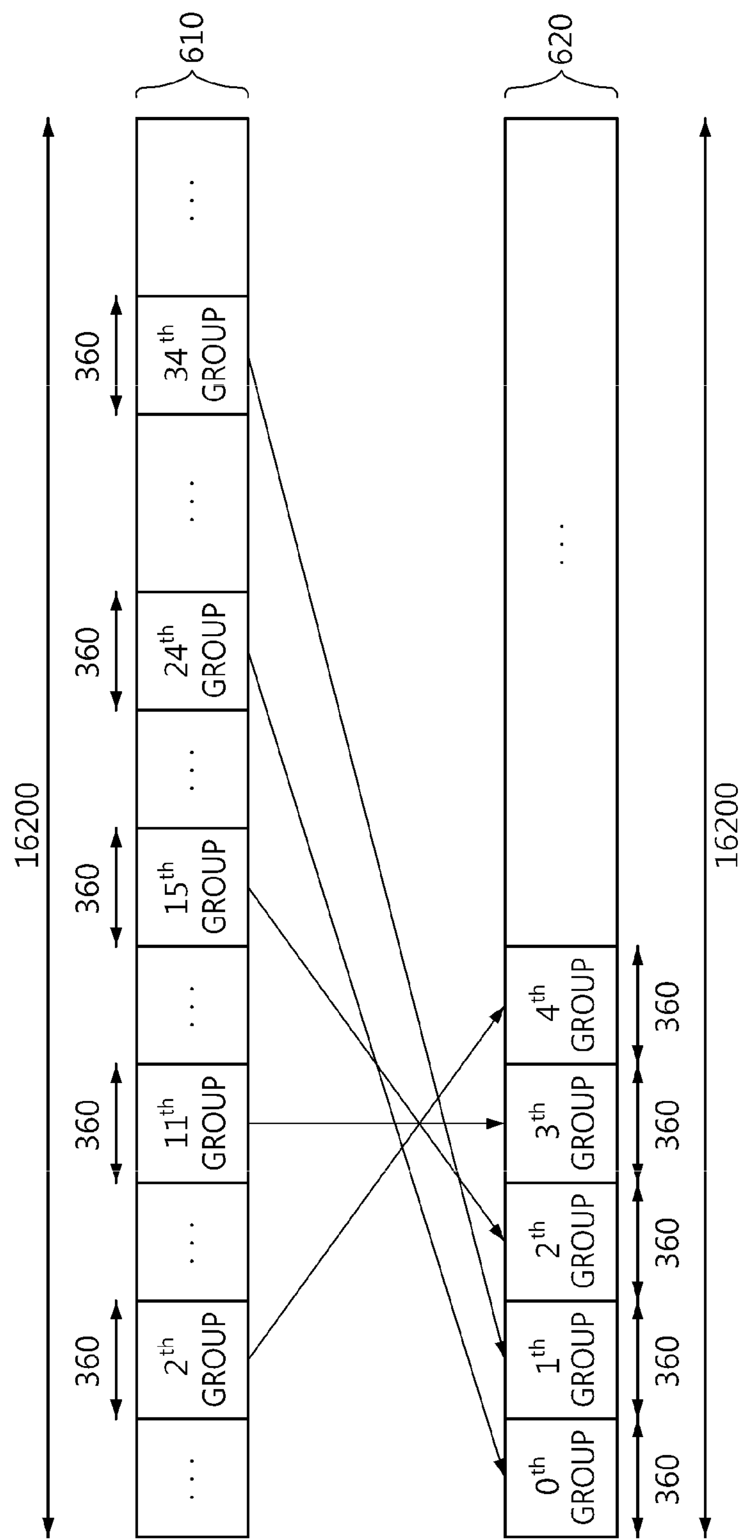
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:

interleaving sequence={24 34 15 11 2 28 17 25 5 38
19 13 6 39 1 14 33 37 29 12 42 31 30 32 36
40 26 35 44 4 16 8 20 43 21 7 0 18 23 3 10 41
9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the 11st bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword $(u_0, u_1, \ldots, u_{N_{ldpc}-1})$ having a length of $N_{ldpc}$ is divided into $N_{group}=N_{ldpc}/36$ (bit groups, as in Equation 9 below:

$$X_j=\{u_k|360\times j\le k<360\times(j+1), 0\le k<N_{ldpc}\} \text{ for } 0\le j<N_{group} \tag{9}$$

where $X_j$ is an j-th bit group, and each $X_j$ is composed of 360 bits.

The LDPC codeword divided into the bit groups is interleaved, as in Equation 10 below:

$$Y_j=X_{\pi(j)}\ 0\le j\le N_{group} \tag{10}$$

where $Y_j$ is an interleaved j-th bit group, and $\pi(j)$ is a permutation order for bit group-based interleaving (bit group-unit interleaving). The permutation order corresponds to the interleaving sequence of Equation 11 below:

interleaving sequence={152 172 113 167 100 163
159 144 114 47 161 125 99 89 179 123 149
177 1 132 37 26 16 57 166 81 133 112 33 151
117 83 52 178 85 124 143 28 59 130 31 157
170 44 61 102 155 111 153 55 54 176 17 68
169 20 104 38 147 7 174 6 90 15 56 120 13 34
48 122 110 154 76 64 75 84 162 77 103 156
128 150 87 27 42 3 23 96 171 145 91 24 78 5
69 175 8 29 106 137 131 43 93 160 108 164
12 140 71 63 141 109 129 82 80 173 105 9 66
65 92 32 41 72 74 4 36 94 67 158 10 88 142
45 126 2 86 118 73 79 121 148 95 70 51 53 21
115 135 25 168 11 136 18 138 134 119 146 0
97 22 165 40 19 60 46 14 49 139 58 101 39
116 127 30 98 50 107 35 62} (11)

That is, when each of the codeword and the interleaved codeword includes 180 bit groups ranging from a 0th bit group to a 179th bit group, the interleaving sequence of Equation 11 means that the 152nd bit group of the codeword becomes the 0th bit group of the interleaved codeword, the 172nd bit group of the codeword becomes the 1st bit group of the interleaved codeword, the 113rd bit group of the codeword becomes the 2nd bit group of the interleaved codeword, the 167th bit group of the codeword becomes the 3rd bit group of the interleaved codeword, . . . , the 35th bit group of the codeword becomes the 178th bit group of the interleaved codeword, and the 62nd bit group of the codeword becomes the 179th bit group of the interleaved codeword.

In particular, the interleaving sequence of Equation 11 has been optimized for a case where QPSK modulation is employed and an LDPC coder having a length of 64800 and a code rate of 7/15 is used.

Figure 7:
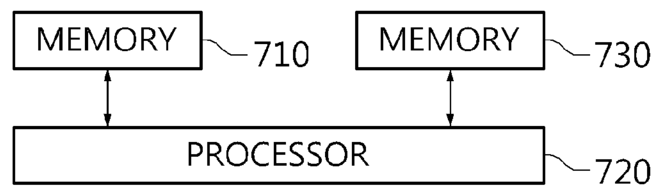
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 64800 and a code rate of 7/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 180 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for QPSK modulation.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 64800 and a code rate of 7/15, and a second memory is a memory that is initialized to 0.

The memories may correspond to $\lambda_i$ (i=0, 1, . . . , N−1) and $P_j$ (j=0, 1, . . . , $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 30240 (=K), a first parity part $\lambda_K, \lambda_{K+1}, \ldots, \lambda_{K+M_1-1}$ corresponding to a dual diagonal matrix included in the PCM and having a length of 1080 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 33480 (=$M_2$).

In this case, the sequence may have a number of rows equal to the sum (30240/360+1080/360=87) of a value obtained by dividing the length of the systematic part, i.e., 30240, by a CPM size L corresponding to the PCM, i.e., 360, and a value obtained by dividing the length $M_1$ of the first parity part, i.e., 1080, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
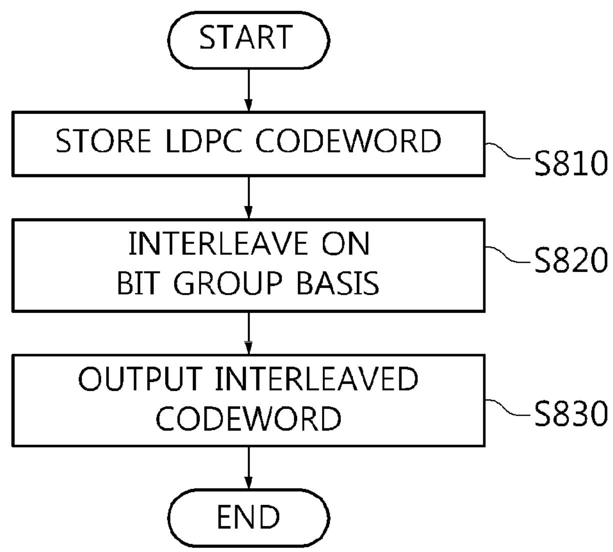
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 64800 and a code rate of 7/15 is stored at step S810.

In this case, the LDPC codeword may be represented by $(u_0, u_1, \ldots, u_{N_{ldpc}-1})$ (where $N_{ldpc}$ is 64800), and may be divided into 180 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 180 bit groups, as in Equation 9.

Moreover, in the bit interleaving method according to the present embodiment, the interleaved codeword is output to a modulator for QPSK modulation at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 64800 and a code rate of 7/15 and a QPSK modulator performing QPSK modulation and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A bit-interleaved coded modulation (BICM) reception device, comprising:

a demodulator configured to perform demodulation corresponding to quadrature phase shift keying (QPSK) modulation;

a bit deinterleaver configured to perform group-unit deinterleaving on interleaved values after the demodulation; and a decoder configured to restore information bits by LDPC-decoding deinterleaved values generated based on the group-unit deinterleaving, the deinterleaved values corresponding to a LDPC codeword having a length of 64800 and a code rate of 7/15, wherein the group-unit deinterleaving is performed on a group basis, wherein the LDPC codeword is encoded using a sequence corresponding to a parity check matrix (PCM) and comprises a systematic part corresponding to information bits and having a length of 30240, a first parity part corresponding to a dual diagonal matrix included in the PCM and having a length of 1080, and a second parity part corresponding to an identity matrix included in the PCM and having a length of 33480.

2. The BICM reception device of claim 1, wherein the group-unit deinterleaving corresponds to a reverse process of interleaving performed by using permutation order, and the permutation order corresponds to an interleaving sequence represented by the following interleaving sequence={152 172 113 167 100 163 159 144 114 47 161 125 99 89 179 123 149 177 1 132 37 26 16 57 166 81 133 112 33 151 117 83 52 178 85 124 143 28 59 130 31 157 170 44 61 102 155 111 153 55 54 176 17 68 169 20 104 38 147 7 174 6 90 15 56 120 13 34 48 122 110 154 76 64 75 84 162 77 103 156 128 150 87 27 42 3 23 96 171 145 91 24 78 5 69 175 8 29 106 137 131 43 93 160 108 164 12 140 71 63 141 109 129 82 80 173 105 9 66 65 92 32 41 72 74 4 36 94 67 158 10 88 142 45 126 2 86 118 73 79 121 148 95 70 51 53 21 115 135 25 168 11 136 18 138 134 119 146 0 97 22 165 40 19 60 46 14 49 139 58 101 39 116 127 30 98 50 107 35 62}.

3. The BICM reception device of claim 2, wherein the group includes 360 values.

4. The BICM reception device of claim 3, wherein the LDPC codeword is represented by $(u_0, u_1, \ldots, u_{N_{ldpc}-1})$ (where $N_{ldpc}$ is 64800), and the group corresponds to a bit group of the LDPC codeword in the following equation:

$$X_j=\{u_k|360\times j\leq k<360\times(j+1),\ 0\leq k<N_{ldpc}\}\text{ for }0\leq j<N_{group}$$

where $X_j$ is an j-th bit group, $N_{ldpc}$ is 64800, and $N_{group}$ is 180.

5. A bit-interleaved coded modulation (BICM) reception method, comprising:

performing demodulation corresponding to quadrature phase shift keying (QPSK) modulation;

performing group-unit deinterleaving on interleaved values after the demodulation; and restoring information bits by LDPC-decoding deinterleaved values generated based on the group-unit deinterleaving, the deinterleaved values corresponding to a LDPC codeword having a length of 64800 and a code rate of 7/15, wherein the group-unit deinterleaving is performed on a group basis, wherein the LDPC codeword is encoded using a sequence corresponding to a parity check matrix (PCM) and comprises a systematic part corresponding to information bits and having a length of 30240, a first parity part corresponding to a dual diagonal matrix included in the PCM and having a length of 1080, and a second parity part corresponding to an identity matrix included in the PCM and having a length of 33480.

* * * * *